United States Patent
Niwa (10) Patent No.: US 6,475,606 B2
(45) Date of Patent: Nov. 5, 2002

(54) CERAMIC BOARD FOR APPARATUSES FOR SEMICONDUCTOR MANUFACTURE AND INSPECTION

(75) Inventor: Takeo Niwa, Gifu (JP)

(73) Assignee: Ibiden Co., Ltd., Gifu (JP)

( * ) Notice: Subject to any disclaimer, the term of this patent is extended or adjusted under 35 U.S.C. 154(b) by 0 days.

(21) Appl. No.: 09/765,361

(22) Filed: Jan. 22, 2001

(65) Prior Publication Data

US 2001/0044015 A1 Nov. 22, 2001

(30) Foreign Application Priority Data

Jan. 21, 2000 (JP) .................................. 2000-017857

(51) Int. Cl.[7] .............................. B32B 3/00; H05B 3/02
(52) U.S. Cl. ..................... 428/210; 219/538; 219/542
(58) Field of Search ..................... 428/210; 219/119, 219/538, 542

(56) References Cited

U.S. PATENT DOCUMENTS

| | | | | |
|---|---|---|---|---|
| 5,049,367 A | * | 9/1991 | Nakano et al. | 423/412 |
| 5,077,245 A | * | 12/1991 | Miyahara | 501/98.5 |
| 5,126,121 A | * | 6/1992 | Weimer et al. | 423/412 |
| 5,219,804 A | * | 6/1993 | Weimer et al. | 501/98.4 |
| 5,874,378 A | * | 2/1999 | Ishida et al. | 501/153 |

FOREIGN PATENT DOCUMENTS

| | | |
|---|---|---|
| JP | 11-278727 | 9/1911 |
| JP | 2275770 | 11/1990 |
| JP | 7065935 | 3/1995 |
| JP | 8097321 | 4/1996 |
| JP | 9-48669 | 2/1997 |
| JP | 9315867 | 12/1997 |
| JP | 11040330 | 2/1999 |
| JP | 11074064 | 3/1999 |
| JP | 11283729 | 10/1999 |
| JP | 11312570 | 11/1999 |
| JP | 2001-163672 | 6/2001 |
| WO | WO 9521139 | 8/1995 |

OTHER PUBLICATIONS

Brochure for High Quality Aluminum Nitride Powder, by Nippon Light Metal Co., Ltd.

Brochure for Ultra High Purity Aluminum Nitride, by Tokuyama Soda Co., Ltd., 1997.

* cited by examiner

Primary Examiner—Cathy Lam
(74) Attorney, Agent, or Firm—Connolly Bove Lodge & Hutz LLP

(57) ABSTRACT

The present invention has for its object to inhibit decrease in Young's modulus at high temperature without compromise in various other characteristics such as heat conductivity.

The present invention is directed to a ceramic board for semiconductor manufacture and inspection comprising a conductor layer internally or on the surface thereof which is composed of nitride ceramics containing oxygen and 0.1 to 50 ppm (wt.) of Si.

4 Claims, 7 Drawing Sheets

CERAMIC BOARD FOR APPARATUSES FOR SEMICONDUCTOR MANUFACTURE AND INSPECTION

FIELD OF THE INVENTION

The present invention relates to a ceramic board for the apparatuses used in-semiconductor manufacture and/or inspection, such as the hot plate (ceramic heater), static chuck and wafer prover.

PRIOR ART

In the semiconductor and/or inspection equipment inclusive of the etching and chemical vapor deposition lines, it is conventional to use heaters and wafer provers based on metallic substrates made of stainless steel, aluminum alloy or the like.

However, metallic heaters have drawbacks such as poor temperature control characteristics, great thickness and bulk, and poor corrosion resistance to corrosive gases.

To obviate those drawbacks, heaters based on ceramic boards such as aluminum nitride in lieu of metal substrates have heretofore been developed.

Such ceramic heaters have the advantage that because of the high rigidity of the ceramic board itself, curling of the board, among other troubles, can be precluded without increasing the board thickness too much.

As a technology of this type, Japanese Kokai Publication Hei-11-40330 discloses a heater comprising a heating element disposed on the surface of a nitride ceramic substrate.

Moreover, Japanese Kokai Publication Hei-9-48668 discloses a heater based on blacked aluminum nitride.

However, the experiments performed by the present inventors demonstrated that such aluminum nitrides suffer decreases in Young's modulus with increasing temperature.

Particularly, it was found that as the temperature rises to 600° C., Young's modulus declines to about 280 GPa. With a declining Young's modulus, the incidence of curling at high temperature is increased so that wafers cannot be uniformly heated. This tendency is particularly pronounced with large, thin ceramic boards not less than 200 mm in diameter and not more than 25 mm in thickness.

SUMMARY OF THE INVENTION

The present invention has for its object to inhibit said decrease in Young's modulus at high temperature without compromise in various other characteristics such as heat conductivity.

The present invention is directed to a ceramic board for semiconductor manufacture and inspection comprising a conductor layer internally or on the surface thereof which is composed of nitride ceramics containing oxygen and 0.1 to 50 ppm (wt.) of Si.

BRIEF DESCRIPTION OF THE NUMERIC SYMBOLS

101: static chuck
1, 43: ceramic board
2, 22, 32a, 32b: chuck positive electrode static layer
3, 23, 33a, 33b: chuck negative electrode static layer
2a, 3a: semi-circular part
2b, 3b: comb-shaped part
4: ceramic dielectric film
5, 49: resistance heating element
6, 18: external terminal pin
9, 90: silicon wafer
11: bottomed holes
12: through holes
16: plated-through holes
42: chuck top conductor layer
45: guard electrode
46: ground electrode
47: grooves
48: suction holes
91: ceramic board
92: heating element
93: terminals
92a: metal cover layer
96: support pins

DEATAILED DESCRIPTION OF THE INVENTION

The nitride ceramics according to the present invention contains oxygen and Si and the Si content thereof is 0.1 to 50 ppm.

It is supposed that, in the present invention, complicated compounds such as Si—nitride component element (Al in the case of aluminum nitride)—O—N form in the grain boundaries of nitride ceramics to prevent decrease in Young's modulus at high temperature.

In addition, because the Si content is not more than 50 ppm in the present invention, the barrier to the conduction of heat in the grain boundaries is low so that the decrease in heat conductivity due to addition of Si is not observed.

Thus, in the present invention, the decrease in Young's modulus at high temperature is inhibited and, at the same time, the heat conductivity is not decreased.

Incidentally, Japanese Kokai Publication Hei-9-48668 discloses semiconductor manufacturing apparatuses utilizing an aluminum nitride (inclusive of Al—O—N) with a Si content of not more than 100 ppm but does not teach or suggest the effect that may be achieved by controlling the level of Si at 50 ppm or less. Therefore, the novelty and inventive step of the present invention should by no means be considered to be jeopardized by the existence of this official gazette.

The Si content mentioned above is preferably 0.1 to 50 ppm (by weight; the same applies hereinafter) as measured by glow discharge-mass spectrometry (GD-MS method). If the Si content is less than 0.1 ppm, the desired inhibitory effect on the decrease in Young's modulus will not be obtained. If it exceeds 50 ppm, the oxide of Si in the ceramic grain boundaries rather detracts from the Young's modulus at high temperature.

Therefore, a range of 0.1 to 50 ppm can be mentioned as the specific range conducive to the desired effect.

The Si content is particularly preferred to be 1 to 30 ppm. In this range, a sufficient thermal conductivity can be insured without detracting from sinterability.

It is considered that Si may be present in the form of Si atoms, Si ions or compounds such as Si—Al—O—N.

The oxygen content is preferably 0.1 to 5 weight %. If the oxygen content is less than 0.1 weight %, sinterability will be adversely affected to lower thermal conductivity and, moreover, there will be no problem that must be solved by the present invention. If the oxygen content is larger than 5 weight %, the very oxygen acts as a barrier to lower thermal conductivity.

The oxygen content is adjusted by heating the starting powder in the air or oxygen or adding sintering aid oxides.

The ceramic board or sintered aluminum nitride body according to the present invention is used as the ceramic board for semiconductor manufacture and/or inspection apparatuses.

The thickness of the ceramic board or sintered aluminum nitride body according to the present invention is preferably not greater than 25 mm.

If the thickness of the ceramic board exceeds 25 mm, the heat capacity of the ceramic board will be so large that particularly when heating and cooling are effected with a temperature control means, the temperature follow-up characteristic will be sacrificed because of the large heat capacity.

Moreover, the problem of curling to be solved by the present invention can hardly arise with thick ceramic boards in excess of 25 mm in thickness.

The thickness is preferably 1 mm to 5 mm.

The ceramic board for apparatuses for semiconductor manufacture or inspection is used not only in the mode where a semiconductor wafer is set in direct contact with the wafer-mounting surface of the ceramic board but also in the mode where the semiconductor wafer is supported with support pins or the like at a certain distance from the ceramic board.

The diameter of the ceramic board according to the present invention is preferably not less than 200 mm. It is particularly preferable that the board diameter be not less than 12 inches (300 mm), for this will be the dominant size range for next-generation semiconductor wafers. Moreover, the problem of curling to be solved by the present invention is inherently not prevalent with ceramic boards up to 200 mm in thickness.

The porosity of said ceramic board is preferably 0% or not greater than 5%. If the porosity exceeds 5%, the thermal conductivity will be decreased or curling at high temperature may develop. The porosity is preferably determined by the method of Archimedes. The sintered compact is crushed, the specific gravity is measured, and the porosity is calculated from true specific gravity and apparent specific gravity.

The nitride ceramics forming the ceramic board for semiconductor production apparatuses in accordance with the present invention include aluminum nitride, silicon nitride, boron-nitride and titanium nitride ceramics.

In the present invention, sintering aids are preferably present in the ceramic board. The sintering aids which can be used include alkali metal oxides, alkaline earth metal oxides and rare earth metal oxides, and, among these, CaO, $Y_2O_3$, $Na_2O$, $Li_2O$ and $Rb_2O_3$ are particularly preferred. Alumina may also be used. The sintering aid content is preferably 0.1 to 20 weight %.

In the present invention, the ceramic board preferably contains 50 to 5000 ppm of carbon.

This is because by incorporating carbon in this manner, the ceramic board can be blackened and the radiant heat can be utilized with advantage when it is applied to a heater.

The carbon may be amorphous or crystalline. With amorphous carbon, the reduction in volume resistivity at elevated temperature can be prevented, while crystalline carbon is useful for preventing the reduction in thermal conductivity at high temperature. Therefore, depending on uses, both crystalline carbon and amorphous carbon may be used in a combination. The particularly preferred carbon content is 200 to 2000 ppm.

When carbon is incorporated in the ceramic board, the proportion of carbon is preferably such that the lightness value will be N4 or less according to JIS Z 8721. The board having a lightness value of this order is satisfactory in the available amount of radiant heat and in hiding power.

With the lightness of ideal black being taken as 0 and the lightness of ideal white as 10, the color dimension is divided into 10 equi-spaced sensory levels of lightness between 0 and 10 and each color is expressed on a scale of N0 through N10. The actual measurement of lightness is made in comparison with color cards corresponding to N0 to N10. In this expression, the first decimal place is rounded to 0 or 5.

The ceramic board for semiconductor application according to the present invention is a ceramic board for use in the apparatuses for the manufacture or inspection of semiconductor devices and, as specific apparatuses, there can be mentioned static chucks, wafer provers, hot plates and susceptors, among others.

The optimum temperature of use of the ceramic board for semiconductor application is not lower than 150° C., preferably not lower than 200° C.

Figure 1:
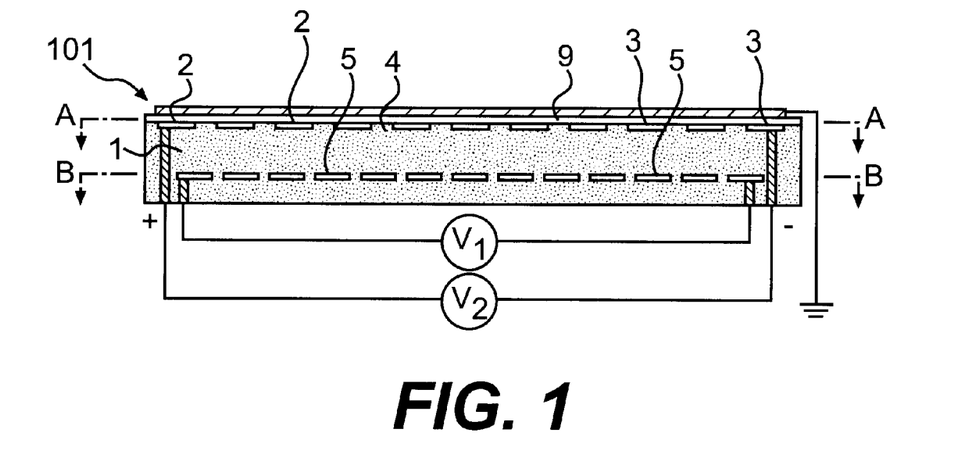
FIG. 1 is a schematic longitudinal section view showing a static chuck as an example of application of the ceramic board according to the invention.
Figure 2:
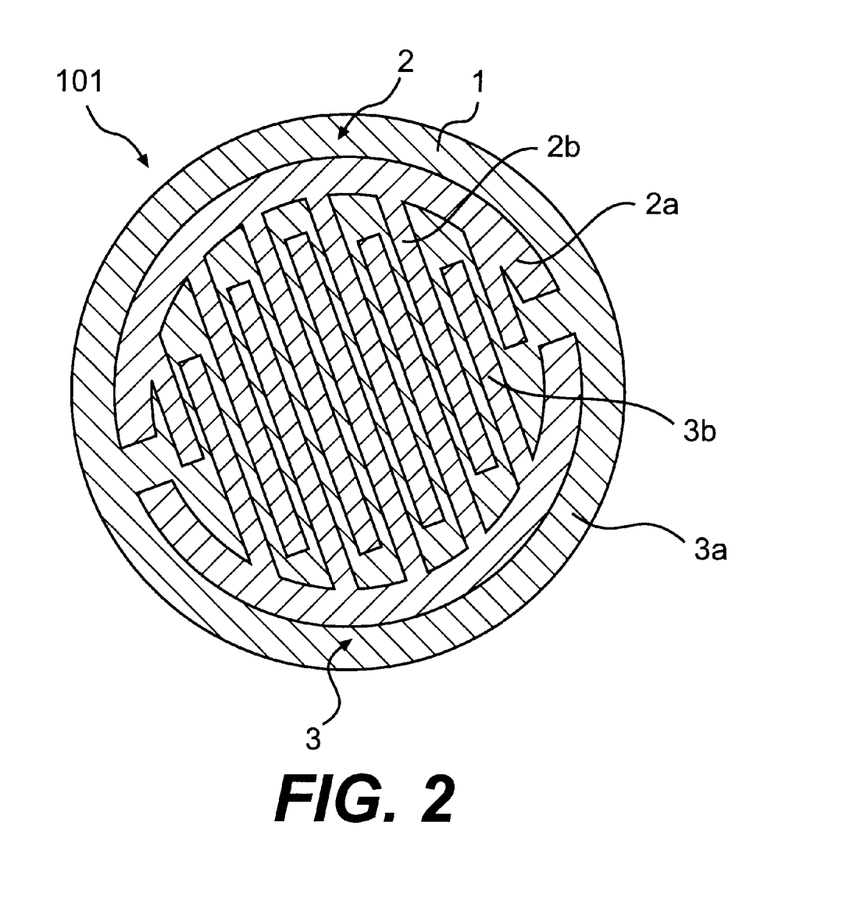
FIG. 2 is a sectional view taken along the line A—A of FIG. 1.
Figure 3:
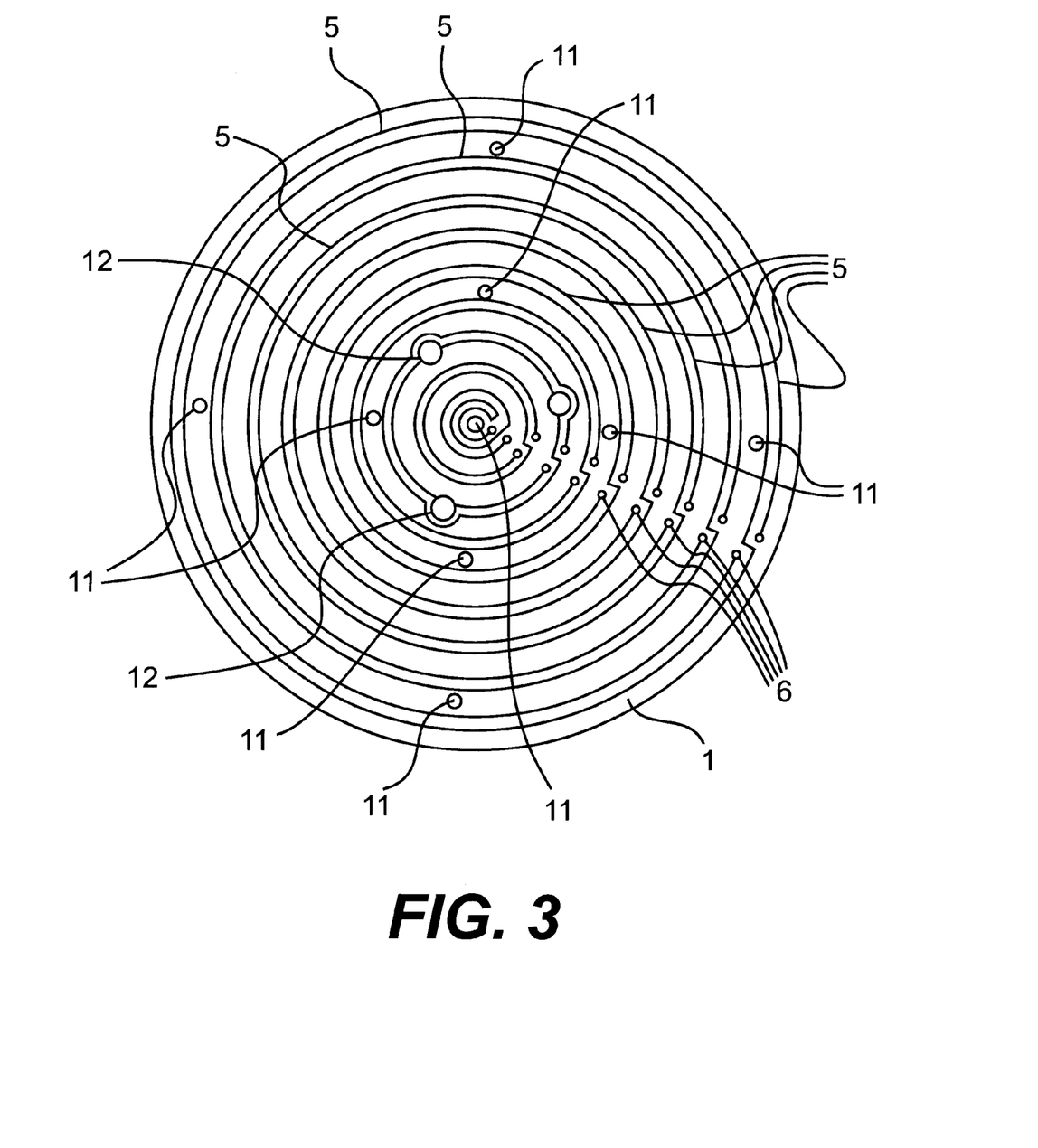
FIG. 3 is a sectional view taken along the line B—B of FIG. 1.

FIG. 1 is a schematic longitudinal cross-section view showing a static chuck as an embodiment of the ceramic board for semiconductor application according to the invention; FIG. 2 is a sectional view of the static chuck as taken along the line A—A of FIG. 1; and FIG. 3 is a sectional view of the same chuck as taken along the line B—B of FIG. 1.

This static chuck 101 comprises a ceramic board 1 which is circular in plan view and, as embedded therein, a static electrode layer comprising a chuck positive electrode static layer 2 and a chuck negative electrode static layer 3. Further shown as set on the static chuck 101 is a silicon wafer 9 which is grounded.

A ceramic layer is formed on said static electrode layer to cover the latter. This ceramic layer functions as a dielectric film for attracting the silicon wafer and will hereinafter be referred to as ceramic dielectric film 4.

As illustrated in FIG. 2, the chuck positive electrode static layer 2 comprises a semi-circular part 2a and a comb-shaped part 2b and the chuck negative electrode static layer 3 also comprises a semi-circular part 3a and a comb-shaped part 3b. These chuck positive electrode static layer 2 and chuck negative static layer 3 are disposed face-to-face in such a manner that the teeth of one comb-shaped part 2b extend in staggered relation with the teeth of the other comb-shaped part 3b. The chuck positive electrode static layer 2 and chuck negative electrode static layer 3 are connected to the + and − terminals of a direct current source so that the DC voltage $V_2$ may be applied between the layers.

Disposed internally of said ceramic board 1 is a resistance heating element 5 configured as concentric circles in plan view as shown in FIG. 3 for controlling the temperature of the silicon wafer 9, and an external terminal pin 6 is rigidly secured to both ends of said resistance heating element 5 so that the voltage $V_1$ can be applied through the terminal pin. Though not shown in FIGS. 1 and 2 but as shown in FIG. 3, this ceramic board 1 is formed with bottomed holes 11 for accepting temperature sensor probes and through-holes 12 for insertion of support pins (not shown) for supporting the silicon wafer 9 in a vertically movable manner. It should be understood that the resistance heating element 5 may be formed on the bottom face of the ceramic board. Moreover, where necessary, an RF electrode may be embedded in the ceramic board 1.

For operating this static chuck 101, a DC voltage $V_2$ is applied between the chuck positive electrode static layer 2 and chuck negative electrode static layer 3. Upon application of $V_2$, a static force is generated between the chuck positive electrode static layer 2 and chuck negative electrode static layer 3 to attract the silicon wafer 9 toward these electrodes through the ceramic dielectric film 4 and set in position on the static chuck 101. After the silicon wafer 9 has been set on the static chuck 101 in this manner, the wafer 9 is subjected to various treatments such as CVD.

The above static chuck having static electrodes and a resistance heating element may have the structure illustrated in FIGS. 1 to 3. Regarding the various constituent members of this static chuck, the members and structural details not described in the foregoing general description of the ceramic board for semiconductor application are now described in detail.

The ceramic dielectric film 4 on the static electrodes is preferably formed from the same material as used for the other members of the ceramic board. This is because green sheets can be prepared in the same process and ceramic board can be sintered in one operation after lamination.

The ceramic dielectric film preferably contains carbon as do the other component members of the ceramic board. This is because the static electrodes can then be hidden and radiant heat can be utilized.

Moreover, said ceramic dielectric film preferably contains an alkali metal oxide, an alkaline earth metal oxide and/or a rare earth metal oxide. These oxides act as sintering aids and contribute to formation of a high-density dielectric film.

The preferred thickness of said ceramic dielectric film is 50 to 1500 $\mu$m. If this ceramic dielectric film is less than 50 $\mu$m thick, a sufficient withstanding voltage value will not be obtained and when the silicon wafer is set thereon and attracted, dielectric breakdown of said film may at times occur. On the other hand, when the thickness of said ceramic dielectric film exceeds 1500 $\mu$m, the increased distance between the silicon wafer and the static electrodes results in a reduction in the attracting force necessary to attract the silicon wafer. The more preferred thickness of the ceramic dielectric film is 5 to 1500 $\mu$m.

The static electrodes to be formed internally of the ceramic board may for example be sintered metal electrodes, conductive ceramic electrodes, or metal foil electrodes. The metal for said sintered metal is preferably at least one member selected from the group consisting of tungsten and molybdenum. The metal foil is also preferably composed of the same material as said sintered metal. The above-mentioned metals are comparatively hardly oxidizable and each has a sufficient electrical conductivity for use as the electrode. The conductive ceramics may be at least one member selected from the group consisting of the carbides of tungsten and molybdenum.

Figure 4:
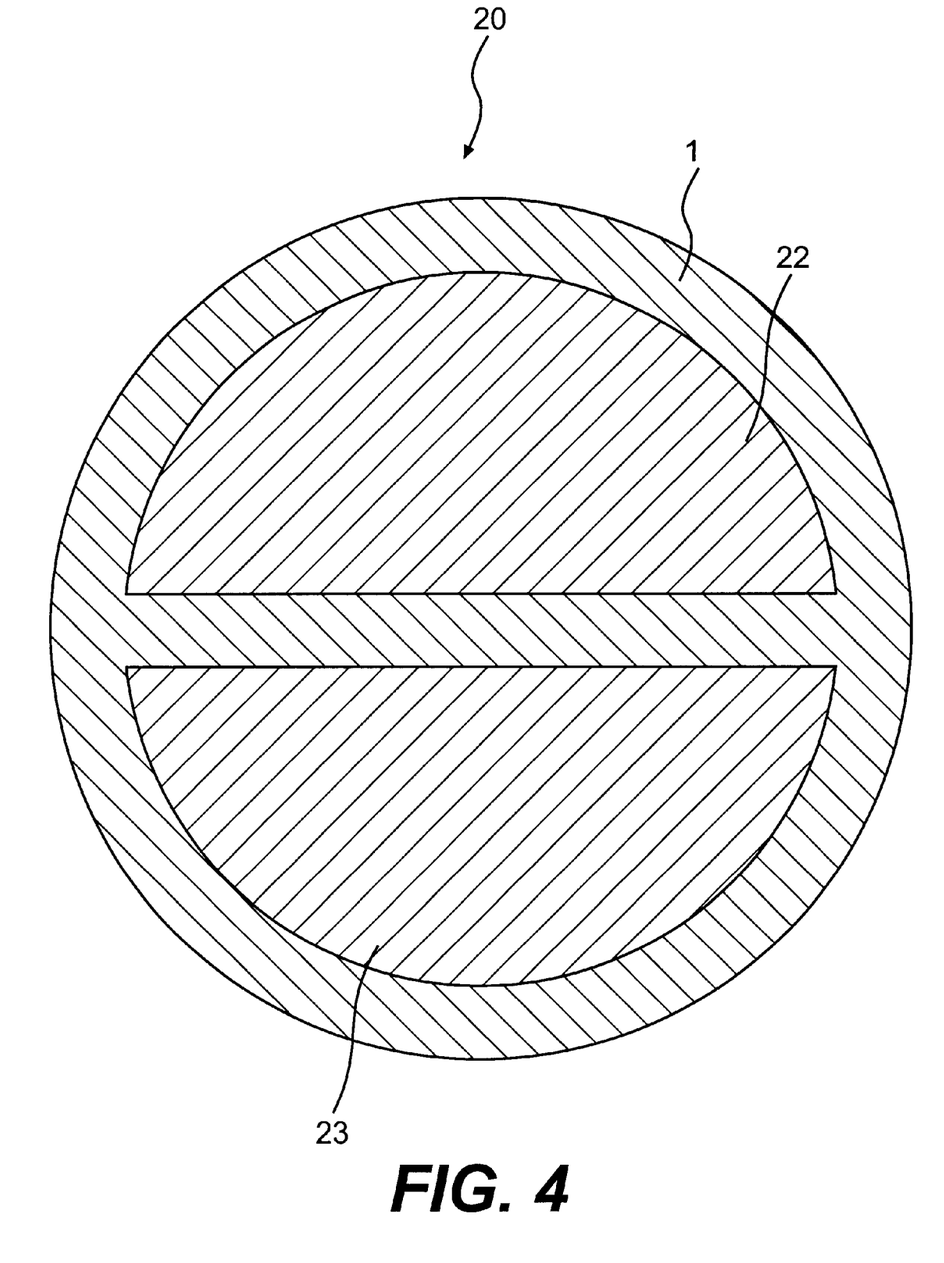
FIG. 4 is a schematic sectional view showing an example of the static electrode pattern of a static chuck.
Figure 5:
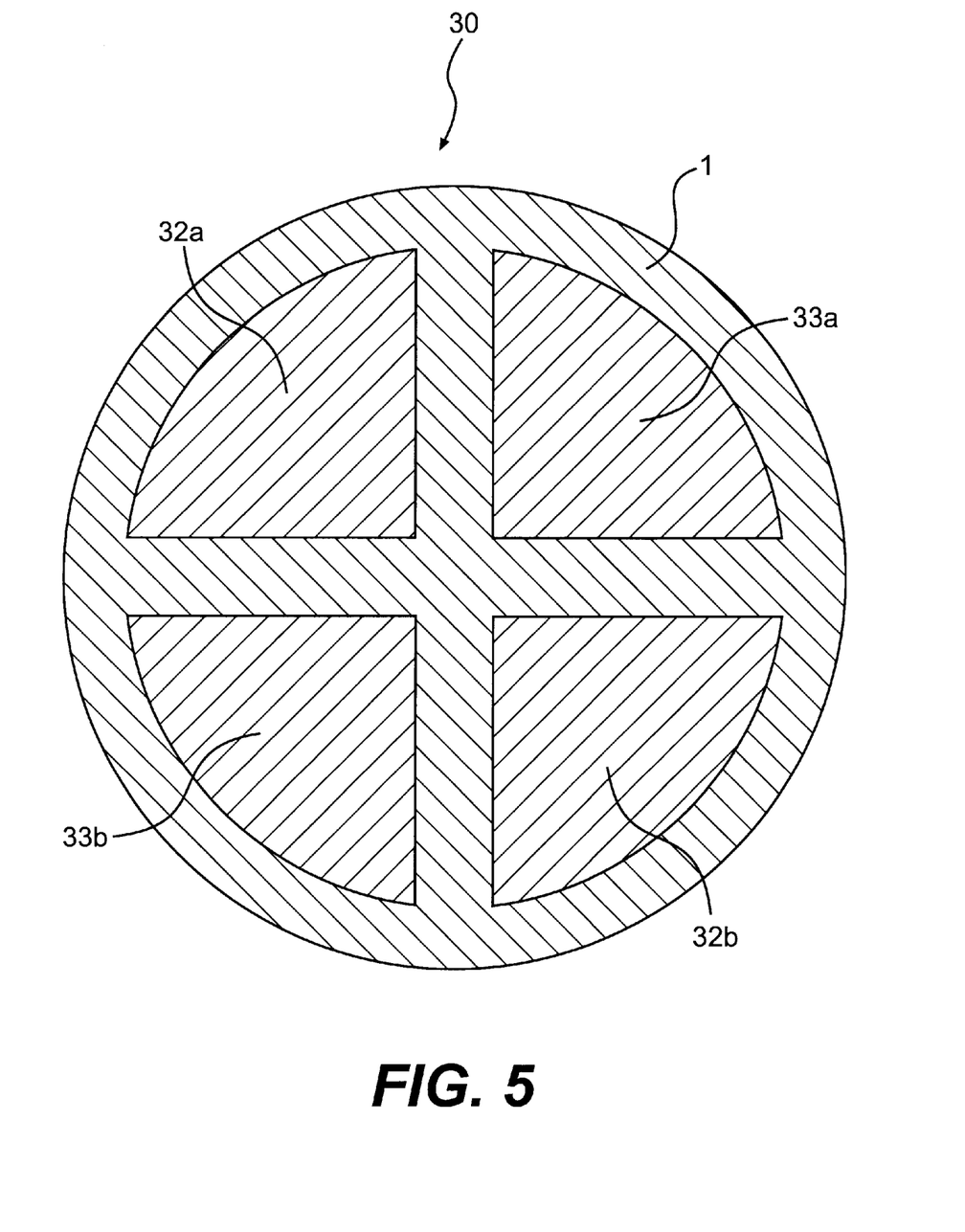
FIG. 5 is a schematic section view showing another example of the static electrode pattern of a static chuck.

FIGS. 4 and 5 are schematic horizontal cross-section views showing other static electrodes for the static chuck. In the static chuck 20 shown in FIG. 4, a chuck positive electrode static layer 22 and a chuck negative electrode static layer 23, both having a semi-circular configuration, are disposed internally of the ceramic board 1. In the static chuck shown in FIG. 5, a couple of chuck positive electrode static layers 32a, 32b and a couple of chuck negative electrode static layers 33a, 33b, all having a quadrant configuration, are formed internally of the ceramic board 1.

The two chuck positive electrode static layers 32a, 32b and the two chuck negative electrode static layers 33a, 33b are respectively disposed in diametrically opposed relation.

When the electrodes are formed in segments of a circle, for instance, the number of segments is not particularly restricted but may for example be 5 or more, and the configuration of each segment is not restricted to a sector.

The resistance heating element may be disposed internally of the ceramic board as illustrated in FIG. 1 or on the bottom face of the ceramic board. In case a resistant heating element is provided, a supporting vessel in which the static chuck is fitted may be provided with a blowing port for introducing a cooling medium such as air as cooling means.

The resistance heating element may for example be formed from a sintered metal or a conductive ceramic material, a metal foil or a metal wire. The sintered metal is preferably at least one member selected from the group consisting of tungsten and molybdenum. These metals are comparatively resistant to oxidation and have sufficiently high resistance values to generate heat.

The conductive ceramic material mentioned above may be at least one member selected from the carbides of tungsten and molybdenum.

When the resistance heating element is to be disposed on the bottom face of the ceramic board, the sintered metal is preferably selected from among noble metals (gold, silver, palladium, platinum, etc.) and nickel. Specifically, silver or silver-palladium, for instance, can be used.

The metal powder for use in the preparation of said sintered metal may for example be spherical, flaky, or mixed spherical-flaky.

The sintered metal body may contain metal oxides. The incorporation of such metal oxides is intended to insure improved adhesion of the metal powder to the ceramic board. The mechanism for this improvement in the adhesion between the metal powder and the ceramic board is not necessarily clear but is supposedly as follows. A thin oxide film is formed on the surface of the metal powder, while the ceramic powder, whether it is an oxide ceramic powder or a non-oxide ceramic powder, an oxide film is formed on the surface thereof. Therefore, these oxide films are sintered together to give an integral layer on the surface of the ceramic board through the added metal oxide to thereby establish an intimate adhesion between the metal powder and the ceramic board.

The metal oxide mentioned above is preferably at least one member selected from among lead oxide, zinc oxide, silica, boron oxide ($B_2O_3$), alumina, yttria, and titania. These oxides improve the adhesion of the metal powder to the ceramic board without increasing the resistance value of the resistance heating element.

The addition amount of said metal oxide is preferably not less than 0.1 weight part but less than 10 weight parts based on each 100 weight parts of the metal powder. By using the metal oxide within this range, the adhesion between the metal powder and the ceramic board can be improved without causing an increase in the resistance value.

The preferred amounts of said lead oxide, zinc oxide, silica, boron oxide ($B_2O_3$), alumina, yttria and titania, based on 100 weight parts of the total metal oxide, are preferably 1 to 10 weight parts of lead oxide, 1 to 30 weight parts of silica, 5 to 50 weight parts of boron oxide, 20 to 70 weight parts of zinc oxide, 1 to 10 weight parts of alumina, 1 to 50 weight parts of yttria, and 1 to 50 weight parts of titania. However, the total amount of these oxides is preferably not more than 100 weight parts, for this is the range contributory to an improved adhesion to the ceramic board.

When the resistance heating element is to be disposed on the bottom face of the ceramic board, the surface of the resistance heating element is preferably covered with a metal layer. The resistance heating element is comprised of a sintered compact of metal powder and, if exposed, is ready to become oxidized and altered in the resistance value. This oxidation of the heating element can be prevented by covering its surface with a metal layer.

The thickness of the metal layer is preferably 0.1 to 10 $\mu$m. Thus, within this thickness range, the oxidation of the resistance heating element can be prevented without changing the resistance value of the resistance heating element.

The metal for use in this covering may be any non-oxidizable metal and, as such, is preferably at least one member selected from the group consisting of gold, silver, palladium, platinum and nickel. Among these, nickel is particularly preferred. The resistance heating element must, of course, have terminals for connection to a power source. While such terminals are attached to the resistance heating element through a solder, nickel prevents thermal diffusion of the solder. The connecting terminals may be terminal pins made of Koval®.

When the resistance heating element is formed internally of the heater plate, the surface of the resistance heating element is not oxidized and, therefore, need not be covered. In disposing the resistance heating element internally of the heater plate, the surface of the resistance heating element may be partially exposed.

The preferred metal foil for the formation of the resistance heating element is an etched or otherwise patterned nickel or stainless steel foil. The patterned metal foil laminated with a resin film or the like may be used.

The metal wire mentioned above may for example be a wire of tungsten or molybdenum.

When the ceramic board for semiconductor application according to the present invention is provided with a conductor on its surface as well as internally, and said internal conductor is at least either a guard electrode or a ground electrode, the ceramic board may function as a wafer prover.

Figure 6:
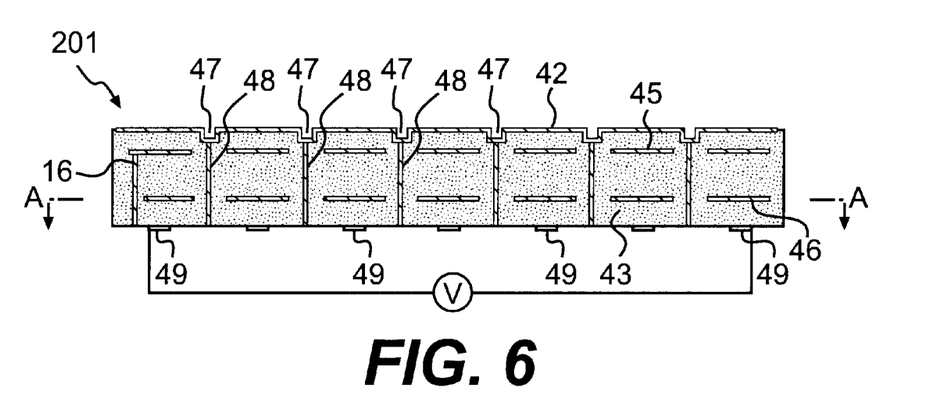
FIG. 6 is a schematic section view showing a wafer prover as an example of application of the ceramic board for semiconductor devices according to the invention.
Figure 7:
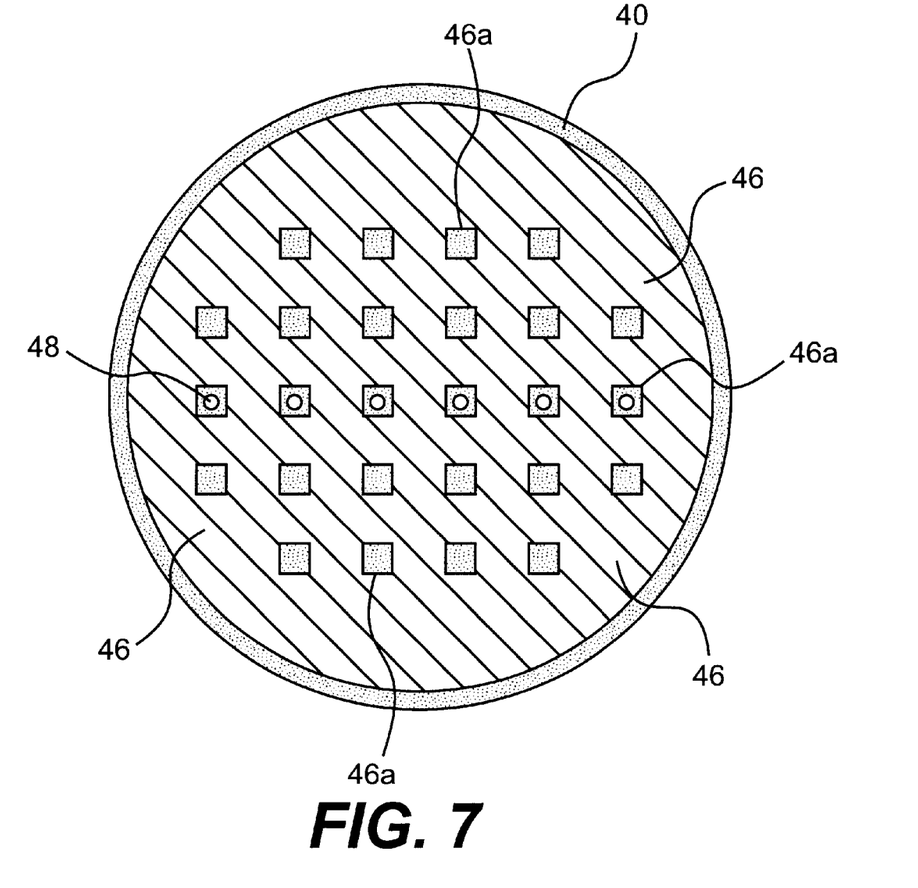
FIG. 7 is a sectional view taken along the line A—A of FIG. 6.

FIG. 6 is a schematic cross-section view showing a wafer prover according to the present invention and FIG. 7 is a sectional view of the same wafer prover as taken along the line A—A of FIG. 6.

In this wafer prover 201, a plurality of grooves 47 configured in concentric circles in plan view are formed on the surface of the ceramic board 43 which is also circular in plan view, with a plurality of suction holes 48 for attracting a silicon wafer to some of said grooves 47, and a chuck top conductor layer 42 for connection to electrodes of a silicon wafer is formed in a circular pattern on most of the surface of the ceramic board 43 inclusive of said grooves 47.

On the bottom face of the ceramic board 43, a heating element 49 configured in concentric circles in plan view as illustrated in FIG. 3 is disposed for controlling the temperature of the silicon wafer and an external terminal pin (not shown) is rigidly connected to both ends of the heating element 49. A guard electrode 45 and a ground electrode 46, patterned as a grid in plan view, are also provided within the ceramic board 43 for eliminating stray capacitance and noise (FIG. 7). The guard electrode 45 and ground electrode 46 may be made of the same material as said static electrodes.

The thickness of the chuck top conductor layer 42 is preferably 1 to 20 $\mu$m. If it is less than 1 $\mu$m, the resistance value will be so high that the electrode function may not be realized. On the other hand, if the thickness exceeds 20 $\mu$m, the strain in the conductor will make the layer ready to peel off.

The chuck top conductor layer 42 can be made of at least one metal selected from among high-melting metals such as copper, titanium, chromium, nickel, noble metals (gold, silver, platinum, etc.), tungsten and molybdenum.

With the wafer prover constructed as above, a conduction test can be performed by placing a silicon wafer formed with an integrated circuitry thereon, pressing a probe card carrying tester pins against the silicon wafer, and applying a voltage under heating and cooling.

Referring to the process for manufacturing the ceramic board for semiconductor application according to the present invention, a typical procedure for fabricating a static chuck is now described, reference being had to the sectional view shown in FIG. 8.

(1) First, a nitride ceramic powder, a boron compound, a binder and a solvent are mixed together and the resulting composition is molded to prepare green sheets 50. When carbon is added, said crystalline and/or amorphous carbon is selected according to the desired characteristics and its amount is accordingly adjusted.

As the boron compound mentioned above, boron nitride, boron carbide, boric acid, etc. can be employed.

As an alternative, boron can be incorporated by a method which comprises contacting a boron nitride sheet with a sintered body and heating them together at 1500 to 1900° C. to effect thermal diffusion.

The nitride ceramic powder mentioned above may for example be an aluminum nitride powder and, where necessary, may be supplemented with said sintering aids such as yttria.

Several or one unit of the green sheet 55 to be overlayed on the green sheet printed with a static electrode layer pattern 51, which is described hereinafter, is intended to serve as a ceramic dielectric film and, therefore, may be different in composition from the ceramic board depending on the objective. An alternative procedure comprises preparing a ceramic board in the first place, forming a static electrode layer thereon, and further forming a ceramic dielectric film thereon.

As the binder, it is preferable to use at least one member selected from the group consisting of acrylic binder, ethylcellulose, butylcellosolve and polyvinyl alcohol.

The solvent is preferably at least one member selected from the group consisting of α-terpineol and glycol.

The above ingredients are mixed and the resulting paste is molded into a sheet using a doctor blade to provide the green sheet 50.

Where necessary, this green sheet 50 can be provided with through holes for accepting slicon wafer-supporting pins and cavities for embedding thermocouples therein. The through holes and cavities mentioned above can be formed by a suitable technique such as punching.

The preferred thickness of the green sheet 50 is about 0.1 to 5 mm.

(2) Then, the green sheet 50 is printed with a conductive paste to form said static electrode layer and resistance heating element.

This printing is performed so as to attain a desired aspect ratio taking the shrinkage of green sheet 50 into consideration. In this manner, the static electrode layer pattern 51 and resistance heating element layer pattern 52 can be accurately formed.

These patterns are formed using a conductive paste containing a conductive ceramic powder or a metal powder.

As the conductive ceramic powder for use in such a conductive paste, a tungsten carbide powder or a molybdenum carbide powder is the best choice. These powders are hardly oxidized and hardly cause a reduction in thermal conductivity.

The metal powder which can be used include powders of tungsten, molybdenum, platinum and nickel.

The average particle diameter of said conductive ceramic powder or metal powder is preferably 0.1 to 5 $\mu$m. With powders outside this particle size range, the conductive paste cannot be neatly printed.

The optimum paste is a conductor paste prepared by mixing 85 to 97 weight parts of a metal or conductive ceramic powder with 1.5 to 10 weight parts of at least one kind of binder selected from among acrylic binder, ethylcellulose, butylcellosolve and polyvinyl alcohol, and 1.5 to 10 weight parts of at least one kind of solvent selected from among $\alpha$-terpineol, glycol, ethanol and butanol.

In addition, said holes, formed by, for example, punching, are filled with the conductor paste to provide plated-through hole patterns 53, 54.

(3) Then, as illustrated in FIG. 8(*a*), the green sheets 50 carrying said printed patterns 51, 52, 53 and 54 are laminated with unprinted green sheets 50. On the green sheet printed with the static electrode layer pattern 51, several or one unit of the green sheet 55 is overlayed. Lamination of the unprinted green sheet 50 on the side carrying the resistance heating element is intended to prevent exposure of the end faces of said plated-through holes and consequent oxidation thereof during the firing for the formation of a resistance heating element. If the firing operation for forming the resistance heating element is carried out with the end faces of the plated-through holes remaining exposed, it will become necessary to perform a sputtering operation using a hardly oxidizable metal such as nickel and, preferably, further perform a covering operation using an Au—Ni brazing material.

(4) Then, as illustrated in FIG. 8(*b*), the laminate is heated under pressure to sinter the green sheets and conductive paste.

Figure 8A:
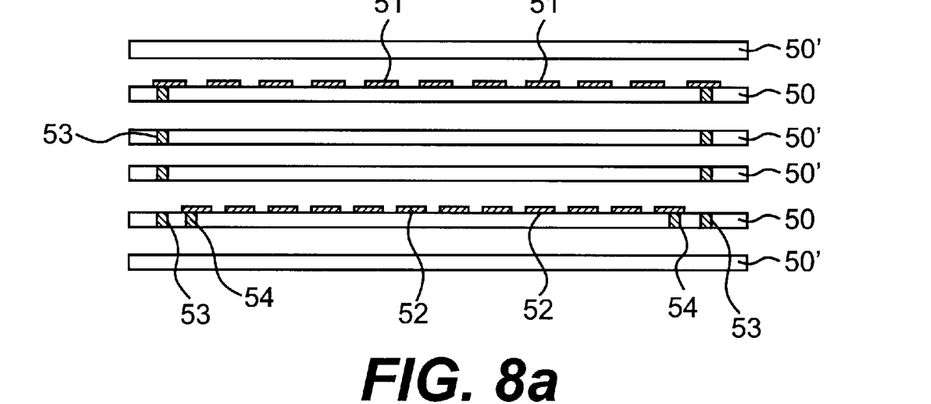
FIGS. 8(a) to (d) are schematic section views showing the process of manufacture of a static chuck.
Figure 8B:
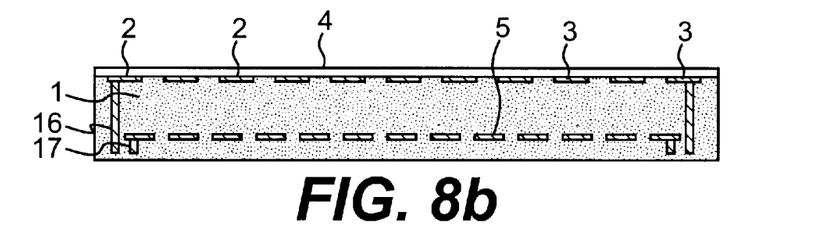

The preferred heating temperature is 1000 to 2000° C. and the preferred pressure is 100 to 200 kg/cm$^2$. This application of heat and pressure is carried out in an inert gas atmosphere. The inert gas may for example be argon gas or nitrogen gas. By this process, the plated-through holes 16, 17, chuck positive electrode static layer 2, chuck negative electrode static layer 3, and resistance heating element 5 are completed.

(5) Then, as illustrated in FIG. 8(*c*), blind holes 13, 14 for connecting external terminals are formed.

Figure 8C:
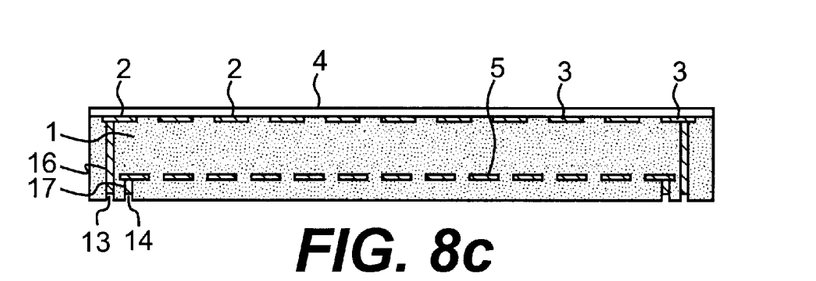

Preferably, the internal walls of said blind holes 13, 14 are made electrically conductive at least in part and the internal walls thus made conductive are connected to the chuck positive electrode static layer 2, chuck negative electrode static layer 3, and resistance heating element 5.

(6) Finally, as illustrated in FIG. 8(*d*), external terminals 6, 18 are set in the blind holes 13, 14 and locked in position by gold brazing. In addition, where necessary, bottomed holes 12 may be formed for embedding thermocouples therein.

The solder which can be used includes various alloys such as silver-lead, lead-tin, bismuth-tin, and other alloys. The thickness of the solder layer is preferably 0.1 to 50 $\mu$m, for within this range, a sufficiently stable soldered connection can be obtained.

Though the manufacture of the static chuck 101 (FIG. 1) has been taken as an example in the above description, a wafer prover can also be manufactured as follows. For example, as in the manufacture of the static chuck, a ceramic board with a resistance heating element embedded in is first fabricated, then the surface of the ceramic board is formed with grooves and a metal layer is formed, by sputtering or soldering, on the surface formed with said grooves.

Thus, the ceramic board and sintered aluminum nitrite body according to the present invention can be applied to various apparatuses for use in the manufacture or inspection of semiconductor devices, such as the hot plate (ceramic heater), static chuck, wafer prover, and susceptor.

As described above, in the ceramic board for the apparatuses used in semiconductor manufacture and inspecting according to the present invention, said Si inhibits decrease in Young's modulus at high temperature without sacrificing heat conductivity (i.e. without detracting from temperature rise-and-fall characteristic).

BEST MODE FOR CARRYING OUT THE INVENTION

The following examples illustrate the present invention in further detail, it being to be understood, of course, that the invention is by no means restricted by these examples.

EXAMPLE 1

(1) Compositions of 1000 weight parts of aluminum nitride powder (average particle diameter: 1.1 $\mu$m, Tokuyama), 4, 10, 20, 30, 40, 40, or 40 weight parts of yttria (average particle diameter: 0.4 $\mu$m), 1.2×10$^{-3}$, 4.8×10$^{-3}$, 0.012, 0.027, 0.037, 0.050, or 0.074 weight parts of SiO$_2$, 120 weight parts of acrylic binder, and the balance of alcohol were respectively spray-dried to provide 7 kinds of granular powders.

(2) Each of these granular powders was packed in a metal mold and formed into a plate (green). This green plate was drilled to form holes corresponding to the through-holes 95 for accepting wafer-supporting pins (diameter: 1.1 mm, depth: 2 mm) and holes 94 corresponding to the bottomed holes for embedding thermocouples therein.

(3) The green plate which had undergone the above processing was hot-pressed at a temperature of 1800° C. and a pressure of 200 kg/cm$^2$ to provide a 5 mm-thick aluminum nitride ceramic plate.

Then, a disk with a diameter of 210 mm was cut out from the above sheet for use as a ceramic plate (heater plate) 91.

(4) The heater plate obtained in (3) above was printed with a conductive paste by the screen printing technique. The printing pattern formed concentric circles.

The conductive paste used was Solbest PS603D (Tokuriki Kagaku Kenkyusho) which is commonly used in the formation of plated-through holes in printed circuit boards.

The above conductive paste was a silver-lead paste containing, based on each 100 weight parts of silver, 7.5 weight parts of metal oxide comprising lead oxide (5 weight %), zinc oxide (55 weight %), silica (10 weight %), boron oxide (25 weight %), and alumina (5 weight %). The silver powder was a flaky powder having an average particle diameter of 4.5 μm.

(5) Then, the heater plate printed with the conductive paste as above was heated and fired at 780° C. to sinter the silver and lead in the conductive paste and bake them onto the heater plate 11 to provide a heating element 12. This silver-lead heating element was 5 μm thick×2.4 mm wide and had an area resistivity of 7.7 mΩ/□.

(6) The heater plate 11 fabricated in (5) above was dipped in an electroless nickel plating bath comprising an aqueous solution of nickel sulfate: 80 g/l, sodium hypophosphite: 24 g/l, sodium acetate: 12 g/l, boric acid: 8 g/l and ammonium chloride: 6 g/l, whereby a metal cover layer (nickel layer) 92a was formed in a thickness of 1 μm on the surface of the silver-lead heating element 12.

(7) The parts corresponding to the terminals for connection to a power source were formed by the screen printing technique using an Ni—Au brazing material.

Figure 9:
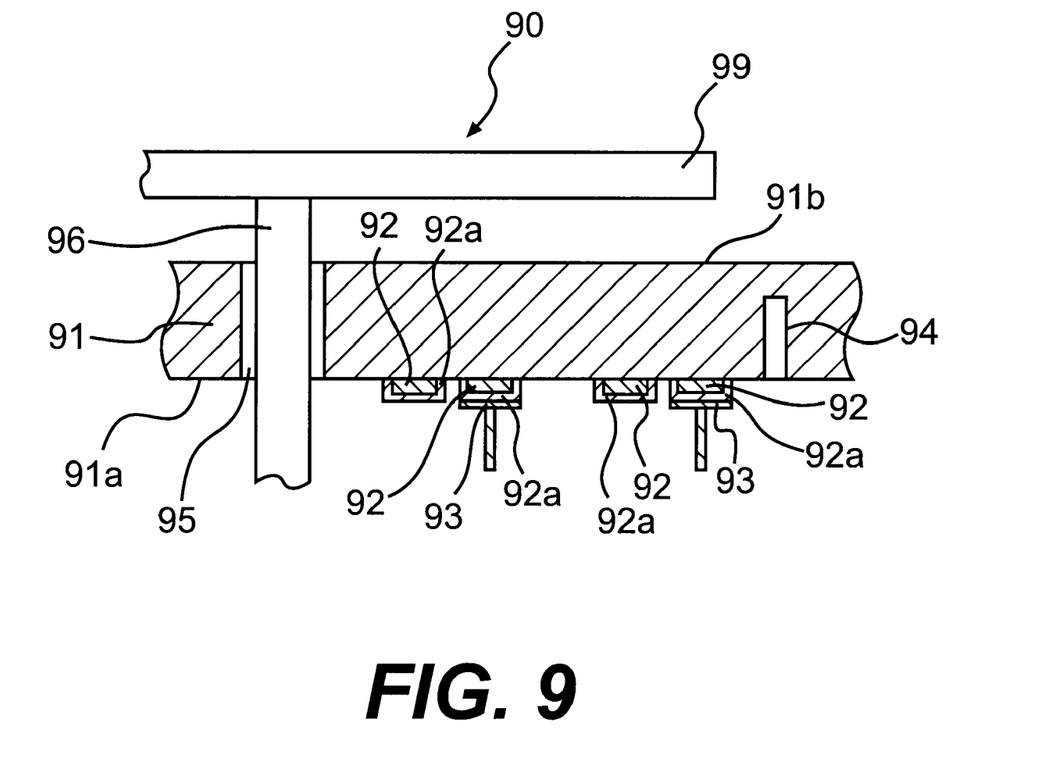
FIG. 9 is a sectional view of the ceramic board of the invention as applied to a heater.

Then, external terminals 93 made of Koval® were superposed thereon and, after the thermocouples for temperature control were inserted, they were connected with an 81.7Au-18.3Ni gold brazing material (fused by heating at 1030° C.) to provide the ceramic heater illustrated in FIG. 9.

COMPARATIVE EXAMPLE 1

A heater was fabricated in basically the same manner as in Example 1 except that the amounts of yttria and Si were altered as shown in Table 1.

The heater of Example 1 and the heater of Comparative Example were respectively heated to 600° C. and the temperature rise time, Young's modulus, and the amount of curl were measured. In addition, the oxygen content and Si content were also determined. The results are shown in Table 1.

COMPARATIVE EXAMPLE 2

Basically the same as Example 1 (yttria: 4 weight parts, Si: 11 weight parts) except that the thickness was 30 mm. The amount of curl as determined by the method described below was 1 μm.

COMPARATIVE EXAMPLE 3

Basically the same as Example 1 (yttria: 4 weight parts, Si: 11 weight parts) except that the diameter was 150 mm.

The amount of curl as determined by the method described below was 1 μm.

Evaluation Methods

1. Oxygen Content

A sample body prepared by sintering under the same conditions as used for the sintered compact of Example was pulverized in a tungsten mortar and a 0.01 g portion was taken and analyzed with an oxygen-nitrogen simultaneous analyzer (LECO; TC-136) under the conditions of a sample heating temperature of 2200° C. and a heating time of 30 seconds.

2. Boron Content

Glow discharge-mass spectrometry (GD-MS) was used. The analysis was entrusted with Shiva Technologies, Inc., U.S.A. (TEL: 315-699-5332, FAX: 315-699-0349).

3. Young's Modulus

The Young's modulus tester using the bending resonance method was used. The testpiece used was 100 mm long, 20 mm wide and 2 mm thick.

The specific determination method was as follows. Thus, with the points of the testpiece which were 0.224 L from its both ends being used as fulcra, the testpiece was suspended with alumina filaments in an electric furnace and the resonance point measurement was started after 10 minutes from the time when the measuring temperature had been reached. The search for the primary resonance point was made by the method which comprises scanning the frequency of a handy oscillator manually in the first place, performing a primary measurement of frequency from the change in the Lissajous's figure on an oscilloscope screen, and performing a secondary measurement with computer-control of the frequency output of a function generator to find the resonance frequency. From the resonance frequency in the primary bending mode as thus obtained, Young's modulus was calculated by means of the following equation (1).

$$E=0.9465\times((m\cdot f^2)/w)\times(L/t)^3\times(1+6.59\times(t/L)^2) \quad (1)$$

where E: Young's modulus (Pa), f: resonance frequency (Hz), L: length (m) of testpiece, w: width of testpiece, t: thickness (m) of testpiece, m: mass (kg) of testpiece.

4. Amount of Curl

The testpiece was heated to 400° C. and maintained at this temperature for 10 minutes. A pressure of 150 kg/cm$^2$ was then applied and the amount of curl was measured with a form analyzer (Kyocera's Nanoway).

TABLE 1

| | Yttria content (wt %) | Oxygen content (wt %) | Si content (ppm wt) | Young's modulus (GPa) | | | | | | | Temperature rise time (sec.) | Amount of curl at 400° C. |
|---|---|---|---|---|---|---|---|---|---|---|---|---|
| | | | | 25° C. | 100° C. | 200° C. | 300° C. | 400° C. | 500° C. | 600° C. | | |
| Example | 0.5 | 0.5 | 0.5 | 320 | 318 | 315 | 312 | 310 | 308 | 298 | 45 | 3 |
| | 1.0 | 0.8 | 2 | 320 | 319 | 314 | 313 | 309 | 307 | 301 | 45 | 2 |
| | 2.0 | 1.2 | 5 | 320 | 318 | 315 | 312 | 310 | 308 | 302 | 40 | 1 |
| | 3.0 | 1.4 | 11 | 320 | 316 | 315 | 310 | 307 | 302 | 300 | 45 | 1 |
| | 4.0 | 1.6 | 15 | 320 | 316 | 314 | 310 | 309 | 302 | 300 | 50 | 1 |
| | 4.0 | 1.6 | 20 | 320 | 316 | 315 | 311 | 309 | 302 | 300 | 50 | 2 |
| | 8.0 | 3.0 | 30 | 320 | 315 | 312 | 310 | 305 | 302 | 295 | 55 | 2 |
| Compar. Ex. | 0 | <0.1 | 2 | 320 | 316 | 311 | 301 | 295 | 290 | 285 | 150 | 5 |
| | 15.0 | 5.5 | 11 | 320 | 318 | 310 | 300 | 295 | 291 | 283 | 200 | 8 |
| | 4.0 | 1.6 | 0.1 | 320 | 317 | 310 | 300 | 294 | 292 | 284 | 50 | 6 |
| | 4.0 | 1.6 | 80 | 320 | 317 | 312 | 302 | 296 | 290 | 285 | 100 | 5 |

It will be apparent from Table 1 that the amount of curl is increased when the Si content is too high or too low. When the Si content is too low, there is no effect of inhibiting the decrease in Young's modulus at high temperature. Conversely when the Si content is too high, it is suspected that oxides are formed in grain boundaries to lower Young's modulus.

Moreover, there is no inhibitory effect on the decrease in Young's modulus when the oxygen content is too large or too low. Moreover, the temperature rise time is prolonged and the through-put of semiconductor wafers is sacrificed.

Moreover, the present invention overcomes the problems which are encountered chiefly with ceramic boards in excess of 200 mm in diameter and not larger than 25 mm in thickness.

EXAMPLE 2

Manufacture of a Static Chuck (FIGS. 1 to 3)

(1) Using a paste comprising a mixture of 1000 weight parts of aluminum nitride powder (Tokuyama; average particle diameter: 1.1 $\mu$m), 40 weight parts of yttria (average particle: diameter: 0.4 $\mu$m), 0.027 weight parts of $SiO_2$, 115 weight parts of acrylate binder, 5 weight parts of dispersant, 0.9 weight part of acrylic binder, 0.9 weight part of acrylic binder, and 530 weight parts of alcohol (1-butanol and ethanol), green sheets 50 having a thickness of 0.47 mm were molded by the doctor blade technique.

(2) After drying at 80° C. for 5 hours, those green sheets 50 requiring processing were punch-formed with holes in the positions corresponding to the through-holes for accepting semiconductor wafer-supporting pins (1.8 mm, 3.0 mm, 5.0 mm in diameter) and holes in the positions corresponding to the plated-through holes for connecting external terminals.

(3) A conductive paste A was prepared by mixing 100 weight parts of a tungsten carbide powder having an average particle diameter of 1 $\mu$m, 3.0 weight parts of acrylic binder, 3.5 weight parts of α-terpineol and 0.3 weight part of dispersant.

A conductive paste B was also prepared by mixing 100 weight parts of a tungsten powder having an average particle diameter of 3 $\mu$m, 1.9 weight parts of acrylic binder, 3.7 weight parts of α-terpineol as solvent and 0.2 weight part of dispersant.

The green sheet 50 was printed with the above conductive paste A by the screen printing technique to form a conductive paste layer. The printing pattern formed concentric circles. The other green sheet 50 was formed with a conductive paste layer according to the static electrode pattern shown in FIG. 2.

(4) Then, the above conductive paste B was filled into the through holes to provide plated-through holes for connecting external terminals.

To the green sheet 50 having the resistance heating element pattern, 34 units of the green sheet 50' not printed with the tungsten paste were laminated on the top side (heating surface) and 13 units of the same green sheet 50' on the bottom face. On top of this laminate, the green sheet 50 formed with a printed conductive paste layer according to the static electrode pattern was further laminated, and further on top of this laminate, 2 units of the green sheet 50' not printed with the tungsten paste were laminated. The whole assembly was pressed at a temperature of 130° C. and a pressure of 80 kg/cm² to provide a final laminate (FIG. 8(a)).

(5) Then, the above laminate was degreased in nitrogen gas at 600° C. for 5 hours and hot-pressed at a temperature of 1890° C. and a pressure of 150 kg/cm² for 3 hours to provide an aluminum nitride ceramic plate having a thickness of 3 mm. From this plate, a disk with a diameter of 300 mm was cut out to provide an aluminum nitride ceramic disk internally having a 6 $\mu$m-thick×10 mm-wide resistance heating element 5, a 10 $\mu$m-thick chuck positive electrode static layer 2 and a 10 $\mu$m-thick chuck negative electrode static layer 3 (FIG. 8(b)).

(6) Then, after the plate obtained in (3) was polished with a diamond grinding wheel, a mask was placed in position and bottomed holes (1.2 mm in diameter and 2.0 mm deep) for accepting thermocouples were formed by SiC blasting.

Figure 8D:
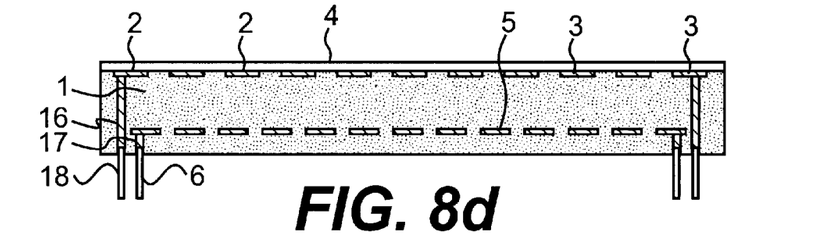

(7) Then, the parts where the plated-through holes have been formed are bored to provide blind holes 13, 14 (FIG. 8(c)), and in these blind holes 13, 14, an Ni—Au brazing material was filled and allowed to reflow under heating at 700° C. to connect external terminals 6, 18 made of Koval® (FIG. 8(d)).

The preferred mode of connection of the external terminals is the 3-point tungsten support system which provides for improved reliability of connection.

(8) Then, a plurality of thermocouples for temperature control were embedded in said bottomed holes to complete the manufacture of a static chuck equipped with a resistance heating element.

When the static chuck was operated at a temperature of 400° C., the amount of curl was about 1 $\mu$m and the temperature rise time to 400° C. was 50 seconds.

EXAMPLE 3

Manufacture of a Wafer Prover 201 (FIG. 6)

(1) A composition prepared by mixing 1000 weight parts of aluminum nitride powder (Tokuyama; average particle diameter: 1.1 $\mu$m), 40 weight parts of yttria (average particle diameter: 0.4 $\mu$m), 0.027 weight parts of $SiO_2$ and 530 weight parts of alcohol (1-butanol and ethanol) was molded by the doctor blade technique to prepare green sheets having a thickness of 0.47 mm.

(2) Then, these green sheets were dried at 80° C. for 5 hours and formed with punched through holes for plated-through holes for connecting the heating element to the external pins.

(3) A conductive paste A was prepared by mixing 100 weight parts of a tungsten carbide powder having an average particle diameter of 1 $\mu$m, 3.0 weight parts of acrylic binder, 3.5 weight parts of α-terpineol as solvent, and 0.3 weight part of dispersant.

A conductive paste B was similarly prepared by mixing 100 weight parts of tungsten powder having an average particle diameter of 3 $\mu$m, 1.9 weight parts of acrylic binder, 3.7 weight parts of α-terpineol as solvent, and 0.2 weight parts of dispersant.

The green sheet was printed with the above conductive paste A by the screen printing technique to provide a guard electrode in a grid form and a ground electrode.

In addition, the conductive paste B was filled into the through holes for plated-through holes for connection to the terminal pins.

Then, 50 units of the printed green sheet and unprinted green sheets were stacked in superimposition and hot-pressed at 130° C. and 80 kg/cm² to provide an integral laminate.

(4) This laminate was degreased in nitrogen gas at 600° C. for 5 hours and, then, hot-pressed at a temperature of 1890° C. and a pressure of 150 kg/cm² for 3 hours to provide a 3 mm-thick aluminum nitride ceramic plate. From this plate, a disk having a diameter of 300 mm was cut out to provide a ceramic disk. The size of plated-through holes 16 was 0.2 mm in diameter and 0.2 mm in depth.

The thickness of the guard electrode 45 and ground electrode 46 was 10 $\mu$m. The position of the guard electrode 45 was 1 mm from the wafer-supporting surface and the position of the ground electrode 46 was 1.2 mm from the wafer-supporting surface. The dimension per side of the conductor-free areas 46a of the guard electrode 45 and ground electrode 46 was 0.5 mm.

(5) After the plate obtained in (4) above was polished with a diamond grinding wheel, a mask was placed in position and the cavities for thermocouples and the wafer-attracting suction grooves 47 (0.5 mm wide, 0.5 mm thick) were provided by SiC blasting.

(6) Then, a layer to form a heating element 49 was formed by printing the surface opposite to the wafer-supporting surface. This printing was performed using a conductive paste. As the conductive paste, Solbest PS603D available from Tokuriki Kagaku Kenkyusho for use in the formation of plated-through holes in printed circuit boards was used. The conductive paste mentioned above was a silver-lead paste containing, based on 100 weight parts of silver, 7.5 weight parts of metal oxide comprising lead oxide, zinc oxide, silica, boron oxide and alumina (in a weight ratio of 5/55/10/25/5, in the order mentioned).

The silver powder used was a flaky powder having an average particle diameter of 4.5 μm.

(7) The heater printed with the conductive paste was heated and fired at 780° C. to sinter the silver and lead in the conductive paste and bake the paste onto the ceramic board 43. In addition, the heater plate was dipped in an electroless nickel plating bath comprising an aqueous solution of nickel sulfate: 30 g/l, boric acid: 30 g/l, ammonium chloride: 30 g/l and Rochelle salt: 60 g/l to deposit a nickel layer (not shown) having a thickness of 1 μm and a boron content of 1 weight % on the surface of the sintered silver 49. Thereafter, this heater plate was annealed at 120° C. for 3 hours.

The heating element comprising a sintered silver body was 5 μm thick and 2.4 mm wide and had an area resistivity of 7.7 mΩ/□.

(8) On the surface formed with grooves 47, a titanium layer, a molybdenum layer and a nickel layer was serially constructed by the sputtering technique. As the sputtering equipment, Japan Vacuum Technology Co.'s SV-4540was used. The sputtering conditions were atmospheric pressure: 0.6 Pa, temperature: 100° C. and power: 200 W and the sputtering time was adjusted according to the kind of metal within the range of 30 seconds to 1 minute.

As analyzed from the image output of a fluorescent X-ray analyzer, the thickness of each film obtained was the titanium layer: 0.3 μm, the molybdenum layer: 2 μm, and the nickel layer: 1 μm.

(9) The ceramic board obtained in (8) above was dipped in an electroless nickel plating bath comprising an aqueous solution of nickel sulfate: 30 g/l, boric acid: 30 g/l, ammonium chloride: 30 g/l and Rochelle salt: 60 g/l to thereby deposit a nickel layer having a thickness of 7 μm and a boron content of not greater than 1 weight % on the surface of said metal layer formed by sputtering and an annealing operation was performed at 120° C. for 3 hours.

The surface of the heating element was not covered by electrolytic nickel plating.

Then, the board was dipped in an electroless gold plating bath containing potassium gold cyanide: 2 g/l, ammonium chloride: 75 g/l, sodium citrate: 50 g/l and sodium hypophosphite: 10 g/l at 93° C. for 1 minute to deposit a 1 μm-thick gold layer on the nickel plate.

(10) Air suction holes 48 extending from the grooves 47 to the reverse side were formed by drilling and blind holes (not shown) for exposing the plated—through holes 16 were also formed. In the blind holes thus exposed, an Ni—Au brazing alloy (Au: 81.5 weight %, Ni: 18.4 weight %, impurity: 0.1 weight %) was caused to reflow under heating at 970° C. to connect external terminal pins made of Koval®. Moreover, external terminal pins of Koval® were attached to the heating element through a solder (tin: 90 weight %/lead: 10 weight %).

(11) Then, a plurality of thermocouples for temperature control were embedded in the cavities to provide a wafer prover heater 201.

The temperature of the ceramic board was increased to 200° C. Then, the amount of curl was about 1 μm and the temperature rise time was as brief as 30 seconds.

What is claimed is:

1. A ceramic board for apparatuses for semiconductor manufacture and inspection comprising a conductor layer formed internally or on a surface thereof, which is composed of nitride ceramics containing 0.1 to 5 weight % of oxygen and 0.1 to 50 ppm of Si.

2. The ceramic heater for apparatuses for semiconductor manufacture and inspection according to claim 1, the thickness of which is 1 to 25 mm.

3. The ceramic heater for apparatuses for semiconductor manufacture and inspection according to claim 1, which forms a disk with a diameter of not less than 200 mm.

4. The ceramic heater for apparatuses for semiconductor manufacture and inspection according to claim 2, which forms a disk with a diameter of not less than 200 mm.

* * * * *